(12) United States Patent
Camillo-Castillo et al.

(10) Patent No.: US 10,446,644 B2
(45) Date of Patent: Oct. 15, 2019

(54) DEVICE STRUCTURES FOR A SILICON-ON-INSULATOR SUBSTRATE WITH A HIGH-RESISTANCE HANDLE WAFER

(71) Applicant: GLOBALFOUNDRIES INC., Grand Cayman (KY)

(72) Inventors: Renata Camillo-Castillo, Essex Junction, VT (US); Hanyi Ding, Colchester, VT (US); Natalie B. Feilchenfeld, Jericho, VT (US); Vibhor Jain, Essex Junction, VT (US); Anthony K. Stamper, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 132 days.

(21) Appl. No.: 14/745,704

(22) Filed: Jun. 22, 2015

(65) Prior Publication Data
US 2016/0372582 A1    Dec. 22, 2016

(51) Int. Cl.
*H01L 29/08*    (2006.01)
*H01L 29/66*    (2006.01)
(Continued)

(52) U.S. Cl.
CPC ........ *H01L 29/0821* (2013.01); *H01L 21/762* (2013.01); *H01L 21/76283* (2013.01);
(Continued)

(58) Field of Classification Search
CPC .............. H01L 29/0804; H01L 29/082; H01L 29/1004; H01L 29/66234; H01L 29/7302; H01L 29/732; H01L 29/0821
See application file for complete search history.

(56) References Cited

U.S. PATENT DOCUMENTS 6,232,649 B1 *   5/2001   Lee ..................... H01L 21/84
                                                         257/347
6,548,364 B2    4/2003   Hsu
(Continued)

FOREIGN PATENT DOCUMENTS

| CN | 1661811 A | 8/2005 |
| CN | 101681909 A | 3/2010 |
| EP | 2685502 A1 | 3/2010 |

OTHER PUBLICATIONS

Zimmermann, L. et al., "Modulator Integration in High-Performance BiCMOS," Group IV Photonics (GFP), 2013 IEEE 10th International Conference, Aug. 2013, pp. 85, 86, 28-30.
(Continued)

*Primary Examiner* — Mark W Tornow
*Assistant Examiner* — Priya M Rampersaud
(74) *Attorney, Agent, or Firm* — Thompson Hine LLP; Anthony Canale

(57) ABSTRACT

Methods for forming a device structure and device structures using a silicon-on-insulator substrate that includes a high-resistance handle wafer. A doped region is formed in the high-resistance handle wafer. A first trench is formed that extends through a device layer and a buried insulator layer of the silicon-on-insulator substrate to the high-resistance handle wafer. The doped region includes lateral extension of the doped region extending laterally of the first trench. A semiconductor layer is epitaxially grown within the first trench, and a device structure is formed using at least a portion of the semiconductor layer. A second trench is formed that extends through the device layer and the buried insulator layer to the lateral extension of the doped region, and a conductive plug is formed in the second trench. The doped region and the plug comprise a body contact.

17 Claims, 9 Drawing Sheets

(51) Int. Cl.
  *H01L 29/737* (2006.01)
  *H01L 29/06* (2006.01)
  *H01L 21/762* (2006.01)
  *H01L 29/732* (2006.01)
(52) U.S. Cl.
  CPC .... *H01L 29/0653* (2013.01); *H01L 29/66242* (2013.01); *H01L 29/7371* (2013.01); *H01L 29/66234* (2013.01); *H01L 29/732* (2013.01)

(56) References Cited

U.S. PATENT DOCUMENTS

| | | | |
|---|---|---|---|
| 7,339,254 | B1 | 3/2008 | Kempf |
| 7,629,649 | B2 | 12/2009 | Miller et al. |
| 7,759,702 | B2 | 7/2010 | Adam et al. |
| 8,008,626 | B2 | 8/2011 | Kub et al. |
| 8,815,654 | B2 | 8/2014 | Gauthier, Jr. et al. |
| 2002/0053705 | A1* | 5/2002 | Kondo ............... H01L 21/8249 257/368 |
| 2002/0094653 | A1 | 7/2002 | Chittipeddi et al. |
| 2003/0162350 | A1* | 8/2003 | Muller ............... H01L 29/66287 438/235 |
| 2003/0219952 | A1* | 11/2003 | Fujimaki ........... H01L 21/82285 438/322 |
| 2004/0012037 | A1* | 1/2004 | Venkatesan ....... H01L 21/76251 257/200 |
| 2005/0184360 | A1 | 8/2005 | Ho et al. |
| 2006/0258110 | A1* | 11/2006 | Pelella ............ H01L 21/823481 438/311 |
| 2008/0308837 | A1* | 12/2008 | Gauthier, Jr. ....... H01L 27/0262 257/107 |
| 2010/0078680 | A1* | 4/2010 | Cheng ............... H01L 21/02532 257/184 |
| 2014/0002187 | A1 | 1/2014 | McPartlin et al. |
| 2014/0017871 | A1 | 1/2014 | Fenouillet-Beranger |
| 2014/0124902 | A1 | 5/2014 | Botula et al. |
| 2014/0370683 | A1* | 12/2014 | Cheng ................... H01L 29/737 438/311 |
| 2016/0285418 | A1* | 9/2016 | Jones ................... H03F 1/0205 |

OTHER PUBLICATIONS

Washio, K. et al., "A 0.2-μm 180-GHz-fmax 6.7-ps-ECL SOI/HRS Self-Aligned SEG SiGe HBT/CMOS Technology for Microwave and High-Speed Digital Applications," IEEE Transactions on Electron Devices, vol. 49, No. 2, Feb. 2002, p. 271-278.

VanNoort, W.D. et al., "Thermal Resistance of (H)BTs on Bulk Si, SOI and Glass," IEEE BCTM 7.2, 2003, pp. 129-132.

Thiebeault, T. et al., "A Study of Ultra-High Performance SiGe HBT Devices on SOI," IEEE BCTM 13.4, 2013, pp. 23-238.

National Intellectual Property Administration, Official Action issued in Chinese Patent Application No. 201610460390.X dated Dec. 5, 2018.

\* cited by examiner

US 10,446,644 B2

DEVICE STRUCTURES FOR A SILICON-ON-INSULATOR SUBSTRATE WITH A HIGH-RESISTANCE HANDLE WAFER

BACKGROUND

The invention relates generally to semiconductor devices and integrated circuit fabrication and, in particular, to fabrication methods and device structures for a bipolar junction transistor.

Bipolar junction transistors may be found, among other end uses, in high-frequency and high-power applications. In particular, bipolar junction transistors may find specific end uses in amplifiers for wireless communications systems and mobile devices, switches, and oscillators. Bipolar junction transistors may also be used in high-speed logic circuits. Bipolar junction transistors are three-terminal electronic devices that include an emitter, an intrinsic base, and a collector defined by regions of different semiconductor materials. In the device structure, the intrinsic base situated between the emitter and collector. An NPN bipolar junction transistor may include n-type semiconductor material regions constituting the emitter and collector, and a region of p-type semiconductor material constituting the intrinsic base. A PNP bipolar junction transistor includes p-type semiconductor material regions constituting the emitter and collector, and a region of n-type semiconductor material constituting the intrinsic base. In operation, the base-emitter junction is forward biased and the base-collector junction is reverse biased. The collector-emitter current may be controlled by the base-emitter voltage.

Improved fabrication methods and device structures are needed for a bipolar junction transistor.

SUMMARY

In an embodiment of the invention, a method is provided for forming a device structure using a silicon-on-insulator substrate that includes a high-resistance handle wafer. A doped region is formed in the high-resistance handle wafer. A first trench is formed that extends through a device layer and a buried insulator layer of the silicon-on-insulator substrate to the high-resistance handle wafer. The doped region includes a lateral extension extending laterally of the first trench. A semiconductor layer is epitaxially grown within the first trench, and a device structure is formed using at least a portion of the semiconductor layer. A second trench is formed that extends through the device layer and the buried insulator layer to the lateral extension of the doped region, and a conductive plug is formed in the second trench. The doped region and the plug comprise a body contact.

In an embodiment of the invention, a device structure is formed using a silicon-on-insulator substrate formed using a silicon-on-insulator substrate having a high-resistance handle wafer, a buried insulator layer, and a device layer. The device structure includes a semiconductor layer in a first trench extending through the device layer and the buried insulator layer to the high-resistance handle wafer. A device structure is at least partially formed in the semiconductor layer. A doped region in the high-resistance handle wafer includes a lateral extension of the doped region extending laterally of the first trench. A plug in a second trench extends through the device layer and the buried insulator layer to the lateral extension of the doped region. The doped region and the plug comprise a body contact.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
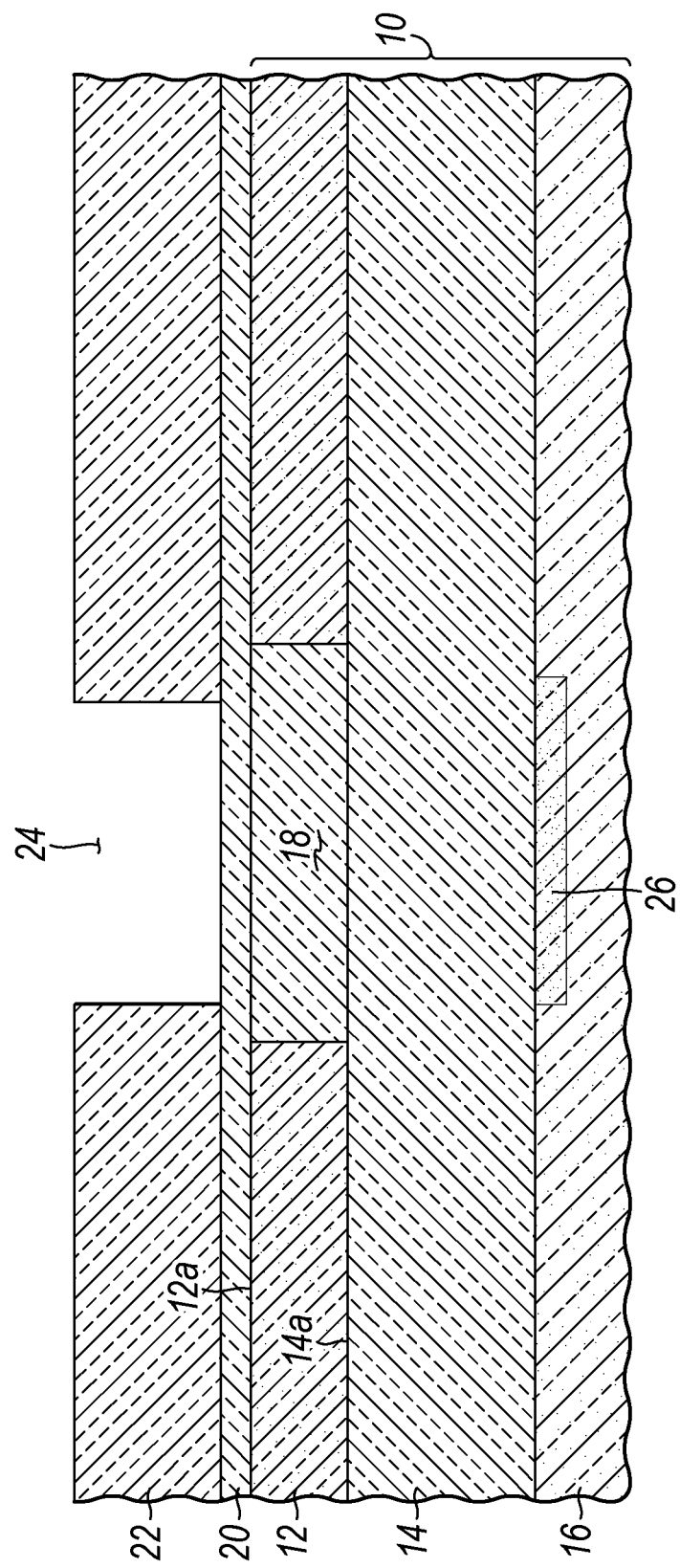
FIGS. 1-4 are cross-sectional views of a portion of a substrate at successive fabrication stages of a processing method for fabricating a device structure in accordance with an embodiment of the invention.

With reference to FIG. 1 and in accordance with an embodiment of the invention, a semiconductor-on-insulator (SOI) substrate 10 includes a device layer 12, a buried insulator layer 14, and a high-resistance handle wafer 16. The device layer 12 is separated from the high-resistance handle wafer 16 by the intervening buried insulator layer 14 and is considerably thinner than the high-resistance handle wafer 16. The device layer 12 is supported on a top surface 14a of the buried insulator layer 14 and is electrically insulated from the high-resistance handle wafer 16 by the buried insulator layer 14. The buried insulator layer 14 may be comprised of an electrical insulator and, in particular, may constitute a buried oxide layer composed of silicon dioxide (e.g., $SiO_2$). The high-resistance handle wafer 16 may be characterized by a resistivity greater than 1 kΩ-cm, and may be comprised of high resistance silicon, sapphire, quartz, alumina, or another suitable material.

A trench isolation region 18 may be formed in the device layer 12 of the SOI substrate 10 by depositing a hardmask, patterning the hardmask and device layer 12 with lithography and etching processes to define trenches, depositing an electrical insulator to fill the trenches, planarizing the electrical insulator relative to the hardmask using a chemical mechanical polishing (process, and removing the hardmask. In one embodiment, the trench isolation region 18 may be comprised of silicon dioxide ($SiO_2$) deposited by low pressure chemical vapor phase deposition (LPCVD), and may penetrate completely through the device layer 12 to the top surface 14a of the buried insulator layer 14.

A dielectric layer 20 is formed on a top surface 12a of the device layer 12 and the trench isolation region 18. Dielectric layer 20 may be comprised of an electrical insulator, such as silicon dioxide ($SiO_2$) deposited using chemical vapor deposition (CVD).

A patterned mask 22 is formed on a top surface of the dielectric layer 20. The mask 22 may be comprised of a layer of sacrificial material that is applied and patterned with photolithography. To that end, the sacrificial material layer may be comprised of a photoresist that is applied by a spin coating process, pre-baked, exposed to a radiation projected through a photomask, baked after exposure, and developed with a chemical developer to form an opening 24 in the patterned mask 22 at an intended location for an opening in the trench isolation region 18.

A doped region 26 may be formed in the high-resistance handle wafer 16 by ion implantation that introduces a concentration of a dopant into the high-resistance handle wafer 16. The conductivity type of the doped region 26 is opposite from the conductivity type of the high-resistance handle wafer 16. In an embodiment, the doped region receives a concentration of a dopant, such as a dopant from Group III of the Periodic Table (e.g., boron) effective to impart p-type conductivity, and the high-resistance handle wafer 16 contains an n-type dopant from Group V of the Periodic Table (e.g., phosphorus (P), arsenic (As), or antimony (Sb)) in a concentration that is effective to impart n-type conductivity. The doped region 26 provides a region of low resistance in the high-resistance handle wafer 16.

The mask 22 may be removed after the doped region 26 is formed. If comprised of a photoresist, the mask 22 may be removed by ashing or solvent stripping, followed by a cleaning process.

Figure 2:
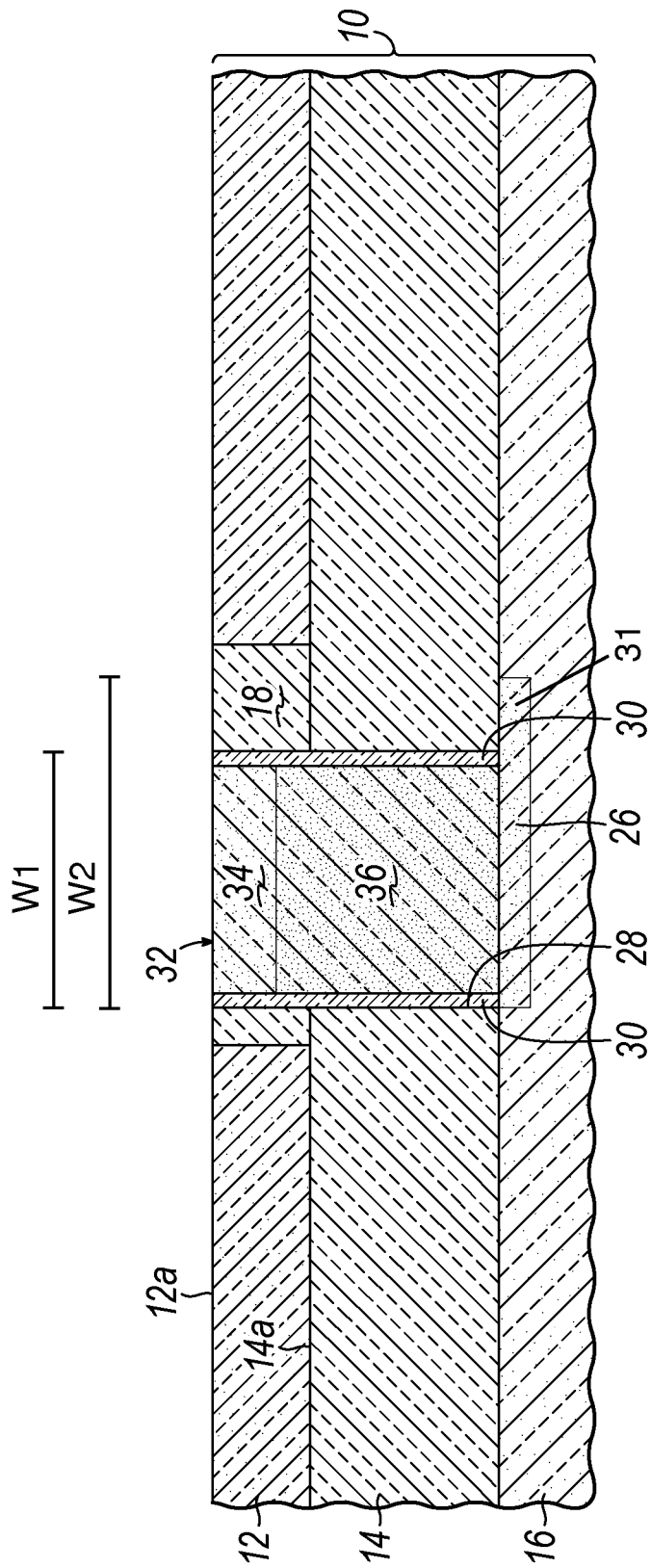

With reference to FIG. 2 in which like reference numerals refer to like features in FIG. 1 and at a subsequent fabrication stage of the processing method, an etching process is used to define a trench 28 that extends through the trench isolation region 18 and the buried insulator layer 14 to the top surface of the high-resistance handle wafer 16. The trench 28 is aligned with the doped region 26. The trench 28 may be formed using a pad oxide and an etch mask with an opening of width W1 defined at the intended location of the trench 28. To that end, the etch mask may comprise a light-sensitive material, such as a photoresist, that is applied by a spin coating process, pre-baked, exposed to light projected through a photomask, baked after exposure, and developed with a chemical developer to define an etch mask. An etching process is used, with the etch mask present, to form the trench 28 of width W1 at the location of the opening. The etching process may be conducted in a single etching step or multiple etching steps, may rely on one or more etch chemistries, and may be performed under controlled conditions with etch selectivity to prevent penetration into the high-resistance handle wafer 16. The mask layer may be removed after the trench 28 is formed by the etching process. If comprised of a photoresist, the mask layer may be removed by ashing or solvent stripping, followed by a conventional cleaning process.

The doped region 26, which forms a portion of a body contact, has a width W2 that is greater than the width W1 of the trench 28. The larger width of the doped region 26 provides a lateral extension 31 of the doped region 26 that extends laterally relative to the trench 28. In subsequent fabrication stages after a semiconductor layer fills the trench 28, the lateral extension 31 of the doped region 26 permits a plug to be formed in a different trench that extends through the device layer 12 and the buried insulator layer 14 to the doped region 26. In the representative embodiment, the doped region 26 is only offset laterally to one side of the trench 28. However, the doped region 26 may be extended to provide lateral offsets on both sides of the trench 28.

Non-conductive spacers 30 are formed on the sidewalls of the trench 28 and may extend vertically relative to the top surface 16a of the high-resistance handle wafer 16. The spacers 30 may be formed by depositing a conformal layer comprised of an electrical insulator, such as silicon nitride ($Si_3N_4$) deposited by chemical vapor deposition, and shaping the conformal layer with an anisotropic etching process, such as reactive ion etching, that preferentially removes the electrical insulator from horizontal surfaces.

A semiconductor layer 32 may be formed inside the trench 28 using an epitaxial growth process, such as a selective epitaxial growth process. Epitaxial growth is a process by which the single-crystal semiconductor material of the semiconductor layer 32 is deposited on the single-crystal semiconductor material of the high-resistance handle wafer 16 and in which the crystal orientation and crystal structure of the single-crystal material of the high-resistance handle wafer 16 is reproduced in the semiconductor material of the semiconductor layer 32. During epitaxial growth, the semiconductor material constituting the semiconductor layer 32 will acquire the crystal orientation and crystal structure of single crystal semiconductor material of the substrate 10, which serves as a template for growth. Because of the selective nature of selective epitaxial growth process, the semiconductor material constituting the semiconductor layer 32 does not nucleate for epitaxial growth from insulator surfaces, such as the top surface of the dielectric layer 20, which is present when the semiconductor layer 32 is formed.

The semiconductor layer 32 contains a concentration of a dopant that provides the constituent semiconductor material with an opposite conductivity type from the doped region 26. In an embodiment, the semiconductor layer 32 comprises an n-type dopant from Group V of the Periodic Table (e.g., phosphorus (P), arsenic (As), or antimony (Sb)) in a concentration that is effective to impart n-type conductivity. The semiconductor layer 32 may include an upper section 34 and a lower section 36 that has a higher concentration of the dopant than the upper section 34, which provides the lower section 36 with a higher electrical conductivity than the upper section 34 after the dopant is activated. The difference in the dopant concentration may be greater than or equal to an order of magnitude with the lower section 36 being heavily doped.

Figure 3:
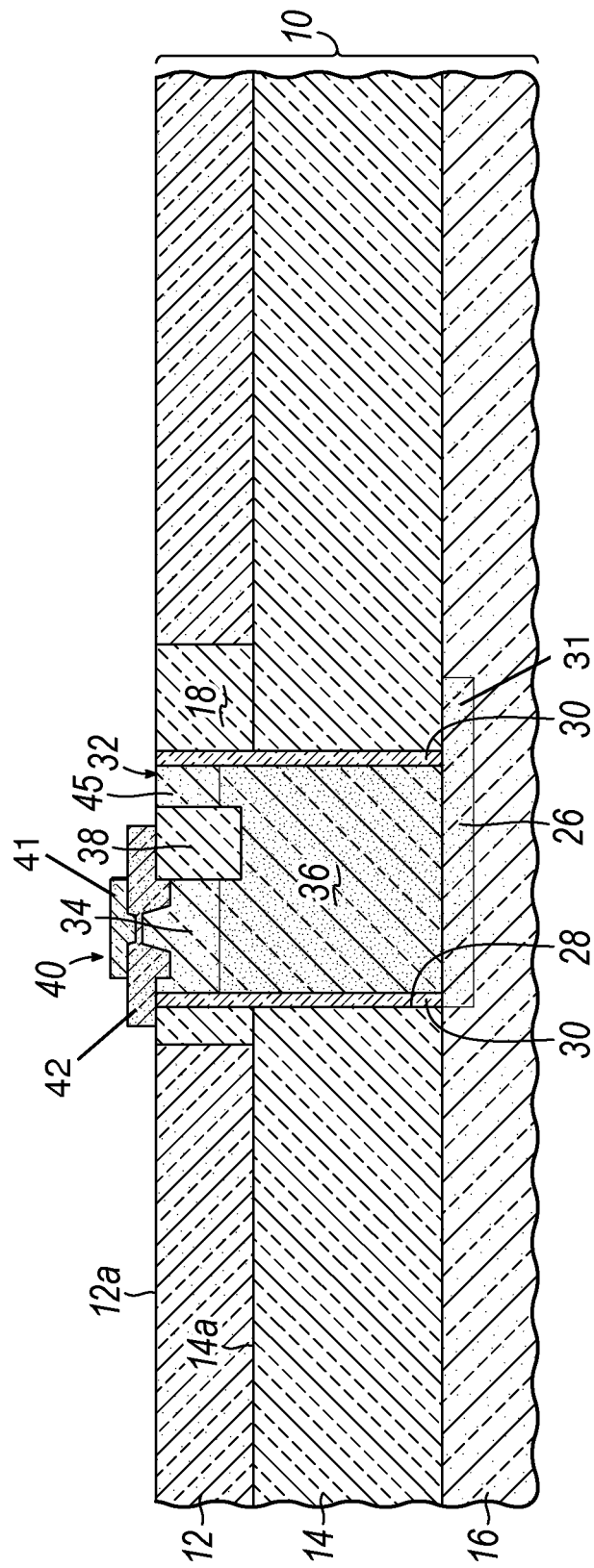

With reference to FIG. 3 in which like reference numerals refer to like features in FIG. 2 and at a subsequent fabrication stage of the processing method, a trench isolation region 38 may be formed in the semiconductor layer 32 by depositing a hardmask, patterning the hardmask and semiconductor layer 32 with lithography and etching processes to define a trench, depositing an electrical insulator to fill the trench, planarizing the electrical insulator relative to the hardmask using a chemical mechanical polishing process, and removing the hardmask. In one embodiment, the trench isolation region 38 may be comprised of silicon dioxide deposited by low pressure chemical vapor phase deposition.

The trench isolation region 38 extends only partially through the thickness of the semiconductor layer 32. In particular, the trench isolation region 38 penetrates through the upper section 34 of the semiconductor layer 32 into the lower section 36 of the semiconductor layer 32. The trench isolation region 38 is positioned laterally inward of the spacers 30 so that a collector contact 45 is defined between the trench isolation region 38 and the spacers 30 from a portion of upper section 34 of the semiconductor layer 32 and a portion of lower section 36 of the semiconductor layer 32.

A device structure 40 is formed using the semiconductor layer 32 in a front-end-of-line (FEOL) portion of the fabrication process and, in the representative embodiment, formed using the upper section 34 of the semiconductor layer 32. The device structure 40 may be a bipolar junction transistor that includes an emitter 41, a collector in the upper section 34 of the semiconductor layer 32, and a base layer 42 that is vertically between the emitter 41 and the collector. The device structure 40 may be characterized as a heterojunction bipolar transistor (HBT) if two or all three of the emitter fingers, the collector, and the base layer are comprised of different semiconductor materials. The device structure 40 may be configured as a power amplifier.

The trench isolation region 38 inside the semiconductor layer 32 separates the base layer 42 from the collector contact 45. The base layer 42 may be comprised of a semiconductor material, such as silicon-germanium (SiGe) in an alloy with a content of silicon (Si) ranging from 95 atomic percent to 50 atomic percent and a content of germanium (Ge) ranging from 5 atomic percent to 50 atomic percent. The germanium content of the base layer 42 may be graded and/or stepped across the thickness of base layer 42. The base layer 42 may comprise a dopant, such as a p-type dopant selected from Group III of the Periodic Table (e.g., boron) in a concentration that is effective to impart p-type conductivity to the constituent semiconductor material and, optionally, carbon (C) to suppress the mobility of the p-type dopant. The base layer 42 may be formed on a top surface of the semiconductor layer 32 using a low temperature epitaxial growth process.

Figure 4:
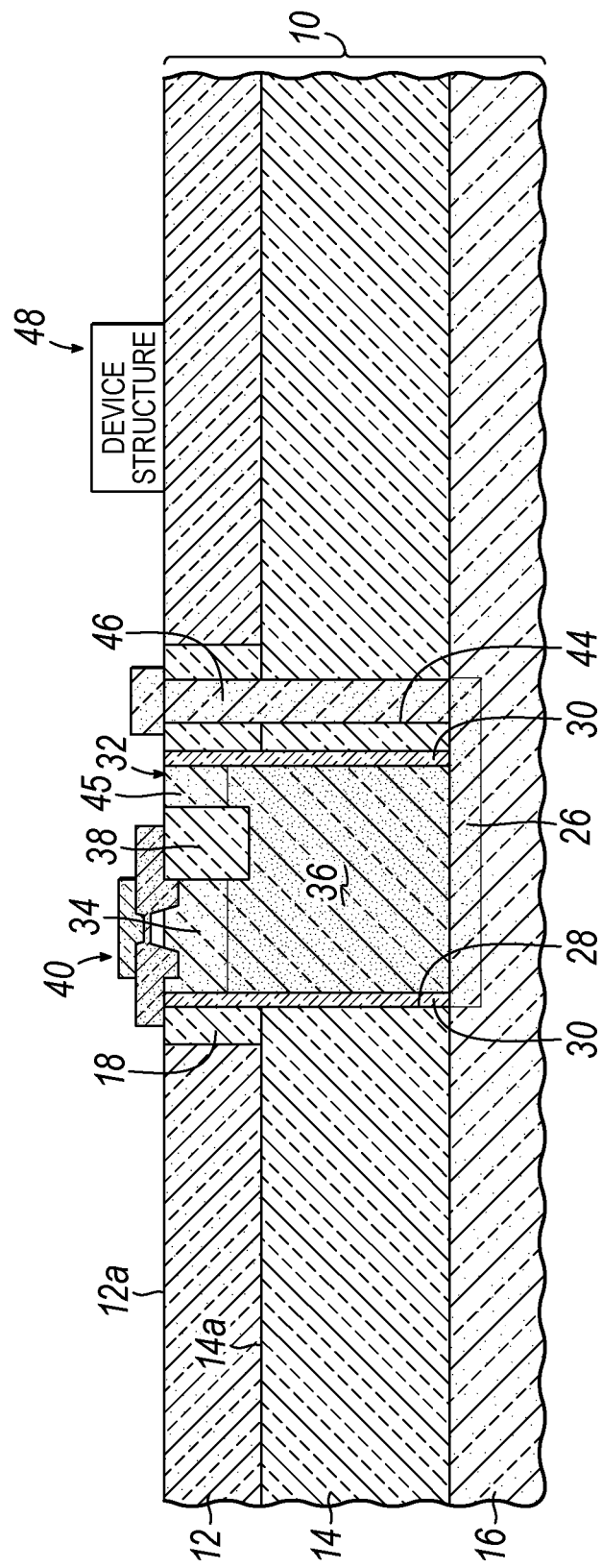

With reference to FIG. 4 in which like reference numerals refer to like features in FIG. 3 and at a subsequent fabrication stage of the processing method, a trench 44 may be opened that extends through the trench isolation region 18 and the buried insulator layer 14 to the lateral extension 31 of the doped region 26 in the high-resistance handle wafer 16. An optional protective layer such as silicon nitride may be applied that covers the device structure 40 during the trench formation process. A plug 46 for the body contact is formed in the trench 44, and provides a conductive path to the lateral extension 31 of the doped region 26. The plug 46 may be comprised of polysilicon doped during deposition to have the same conductivity type as the doped region 26. In an alternative embodiment, the plug 46 may be located on more than one side of the device structure 40 from the collector contact 45 in a symmetric fashion. Optionally, the trench 44 may be filled with a different conductor, such as a metallic conductor like titanium-nitride-lined tungsten. The plug 46 may be formed using a damascene process, in which case a planar dielectric is formed over the wafer and device structure 40 prior to etching the trench 44. Alternatively, the trench 44 and plug 46 may be formed prior to forming the device structure 40.

During the front-end-of-line portion of the fabrication process, the doped region 26, the semiconductor layer 32, the trench isolation region 38 in the semiconductor layer 32, and the device structure 40, are replicated across at least a portion of the surface area of the SOI substrate 10. Another device structure 48 may be formed at a different location on the SOI substrate 10. The device structure 48 may be a low noise amplifier comprising another bipolar junction transistor, a switch comprised of a field-effect transistor, a field-effect transistor, a passive device (e.g., a resistor or a capacitor), a varactor, etc.

Middle-of-line (MOL) and back-end-of-line (BEOL) processing follows, which includes silicide formation, formation of contacts and wiring for a local interconnect structure to the device structures 40, 48, and formation of dielectric layers, via plugs, and wiring for an interconnect structure coupled by the local interconnect structure with the device structures 40, 48. Other active and passive circuit elements, such as diodes, resistors, capacitors, varactors, and inductors, may be integrated into the interconnect structure and available for use in the integrated circuit.

Figure 5:
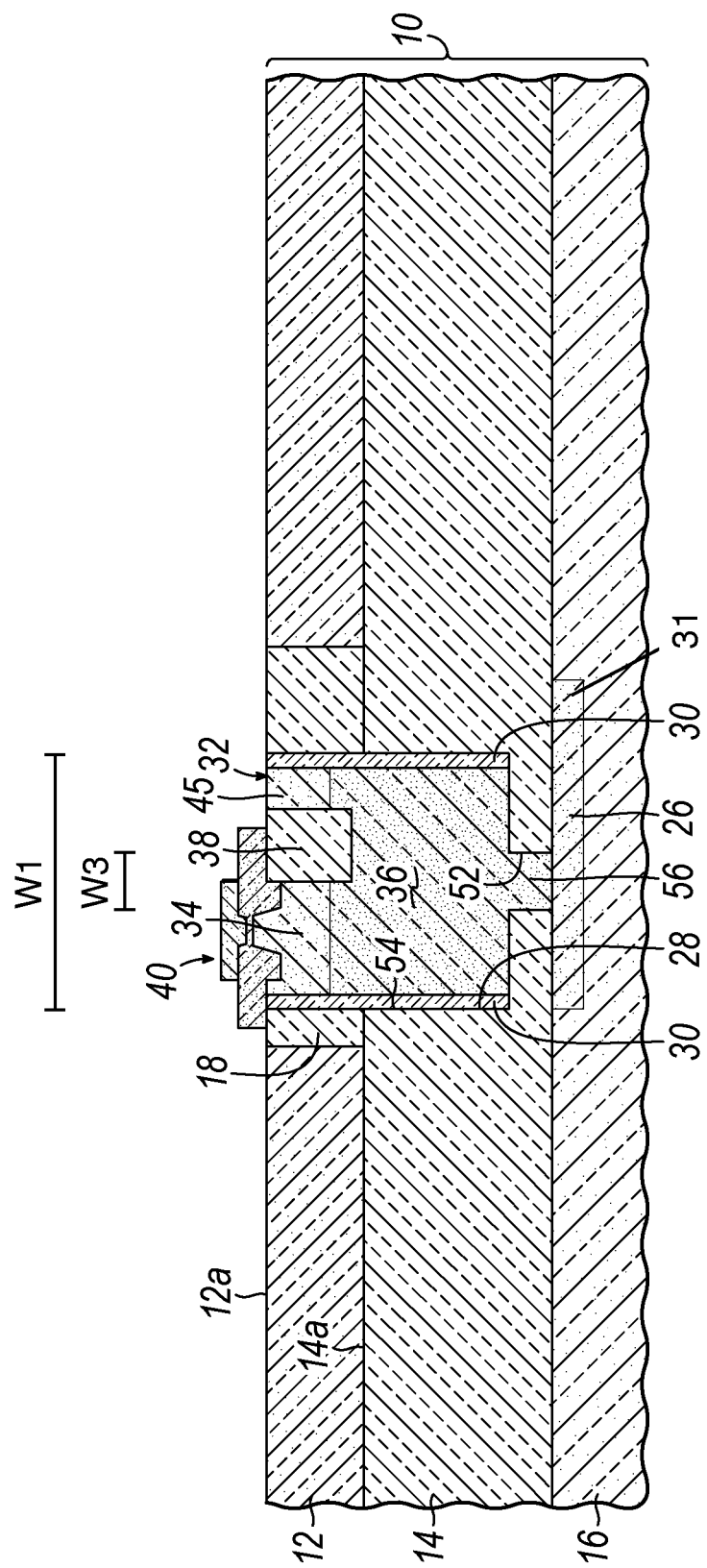
FIG. 5 is a cross-sectional view of a substrate portion processed by a processing method for fabricating a device structure in accordance with an alternative embodiment of the invention

With reference to FIG. 5 in which like reference numerals refer to like features in FIG. 2 and in accordance with an alternative embodiment, the trench 28 may be formed with an upper portion 54 and a lower portion 52 that is narrower than the upper portion 54. The narrow lower portion 52 of the trench 28 has a width W3 and the upper portion 54 of the trench 28 has the width W1, which is greater than width W3. A portion 56 of the lower section 36 of the semiconductor layer 32, which is located adjacent to the doped region 26, conforms to the shape of the narrow lower portion 52 of trench 28.

In an embodiment, the conditions for the etching process forming the upper portion 56 of trench 28 are controlled such that the upper portion 54 only partially penetrates partially through the buried insulator layer 14 and does not penetrate to the high-resistance handle wafer 16 and doped region 26. The narrow lower portion 52 of the trench 28 may be formed by applying another etch mask, after the upper portion 54 of the trench 28 is formed using the patterned mask 22, with an opening having a dimension matching width W3 in a dual damascene patterning and etch fashion. The lower portion 52 and the upper portion 54 of the trench 28 are formed before the spacers 30 and semiconductor layer 32 are formed. After the spacers 30 and the semiconductor layer 32 are formed, the process continues as described above in connection with FIG. 3.

The modification to the trench 28 that introduces the narrow lower portion 52 may be effective to reduce the collector-substrate capacitance along with a reduction in the area. The reduction may be more substantial for millimeter-wave applications and permits tailoring of the collector-substrate capacitance.

Figure 6:
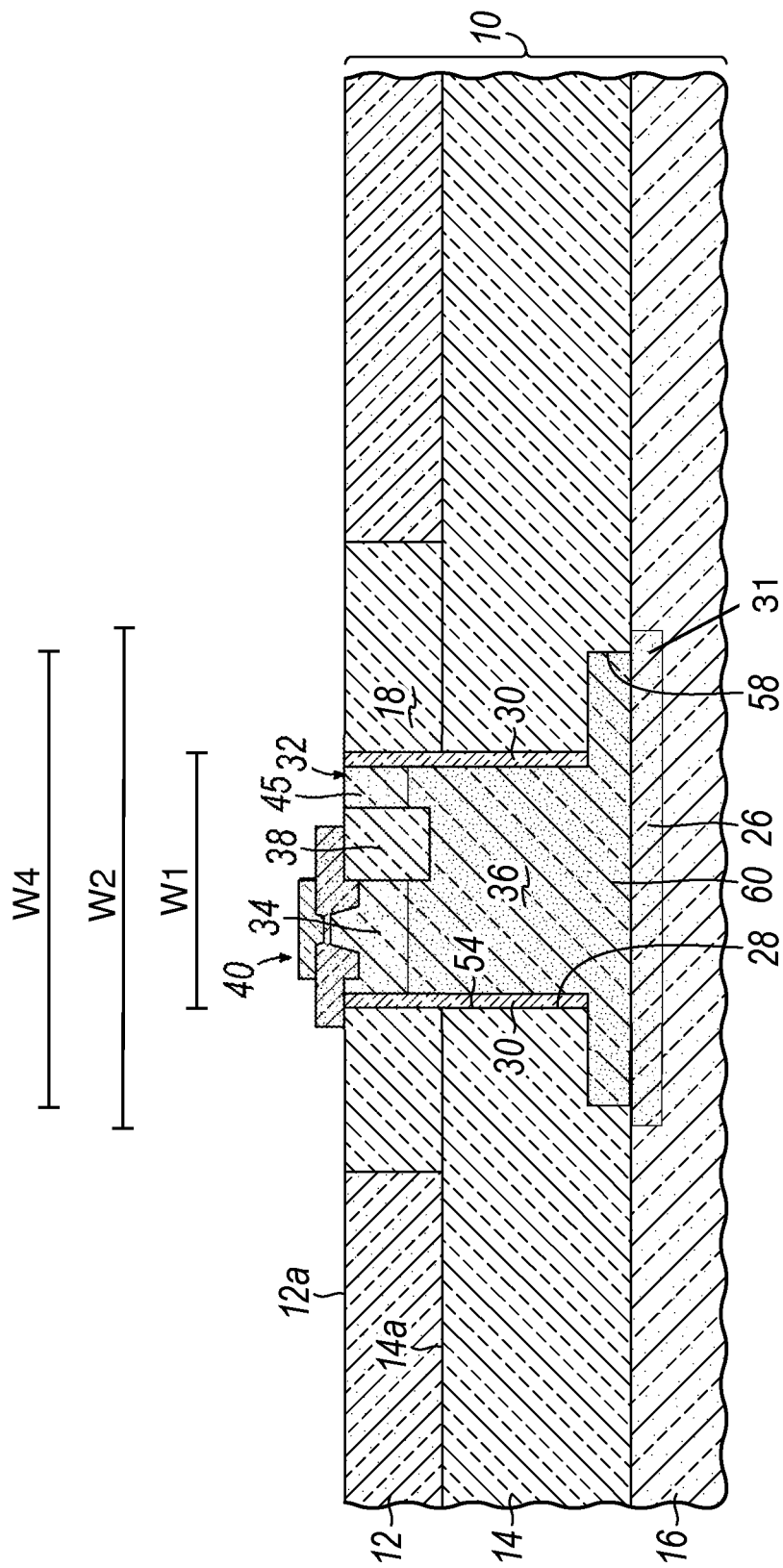
FIG. 6 is a cross-sectional view of a substrate portion processed by a processing method for fabricating a device structure in accordance with an alternative embodiment of the invention.

With reference to FIG. 6 in which like reference numerals refer to like features in FIG. 2 and in accordance with an alternative embodiment, the trench 28 may be formed with a wide lower portion 58 that is wider than the upper portion 54. The wide lower portion 58 is located at the base of the trench 28 and adjacent to the high-resistance handle wafer 16 and doped region 26. The wide lower portion 58 of the trench 28 has a width W4 that is greater than the width W1 of the upper portion 54 of the trench 28. A portion 60 of the lower section 36 of the semiconductor layer 32, which is located adjacent to the doped region 26, conforms to the shape of the wide lower portion 58 of trench 28.

In an embodiment, the wide lower portion 58 of the trench 28 may be formed by a wet chemical etching process that is performed after the upper portion 54 of the trench 28 is formed and after the spacers 30 are formed. The upper portion 54 and wide lower portion 58 of the trench 28 are formed before the semiconductor layer 32 is formed. The wet chemical etching process also deepens the trench 28 so that the base is coextensive with the high-resistance handle wafer 16 and doped region 26. After the semiconductor layer 32 is formed, the process continues as described above in connection with FIG. 3.

The wide lower portion 58 of the trench 28 may promote termination of propagating dislocations in the material of semiconductor layer 32 in the lower portion 58 to the periphery of the trench 28. As a result, the propagation of dislocations into the semiconductor layer 32 in the upper portion 54 of the trench 28 may be reduced.

The width W2 of the doped region 26 is greater than the width W4 of the wide lower portion 58 of the trench 28. The greater width of the doped region 26 provides the lateral extension 31 of the doped region 26 that extends laterally relative to the wide lower portion 58 of the trench 28. In subsequent fabrication stages after the semiconductor layer 32 fills the trench 28, the lateral extension 31 of the doped region 26 permits a plug to be formed in a different trench that extends through the device layer 12 and the buried insulator layer 14 to the doped region 26.

Figure 7:
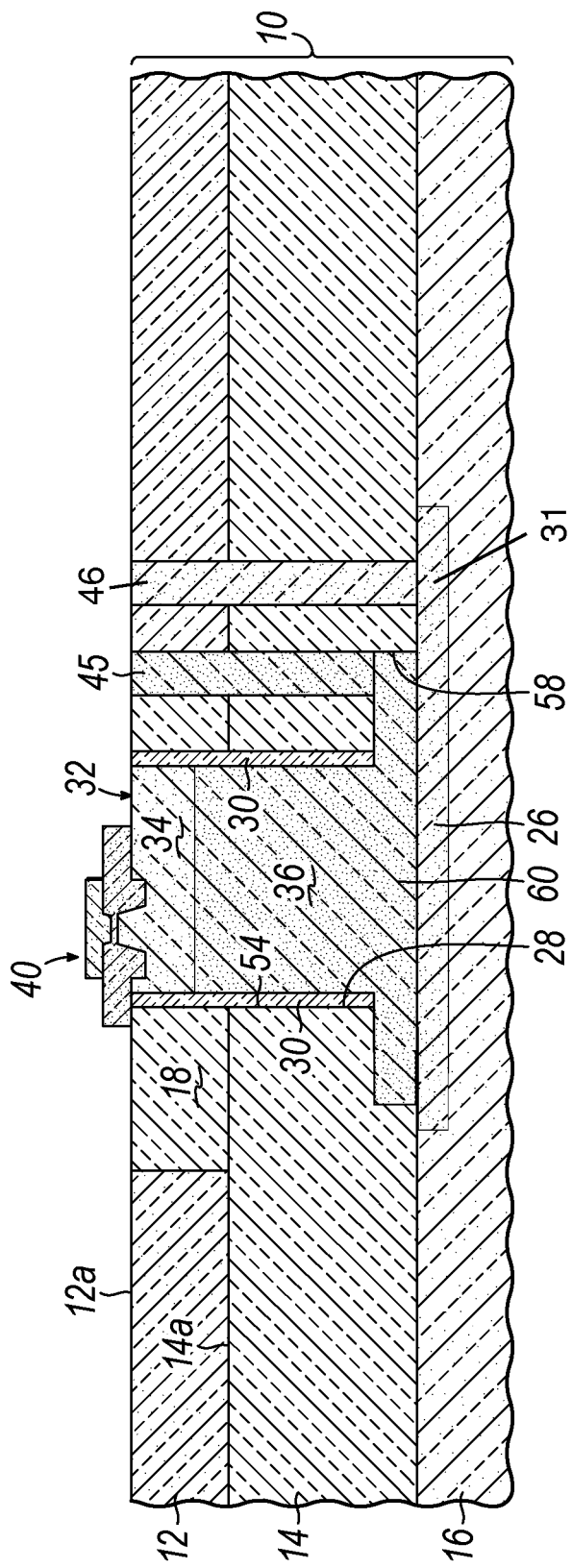
FIG. 7 is a cross-sectional view of a substrate portion processed by a processing method for fabricating a device structure in accordance with an alternative embodiment of the invention.

With reference to FIG. 7 in which like reference numerals refer to like features in FIG. 6 and in accordance with an alternative embodiment, the trench isolation region 38 may be eliminated from the construction of the device structure 40 and the collector contact 45 may be formed outside of the trench isolation regions 18. The trench isolation region 38 can be eliminated because the base and collector contact isolation is not needed due to the relocation of the collector contact 45 outside of the boundaries of semiconductor layer 32. The collector contact 45 may reach through the trench isolation region 18 and the buried insulator layer 14 to the wide lower portion 58 of the semiconductor layer 32. After the semiconductor layer 32 is formed, the process continues as described above in connection with FIG. 3.

Figure 8A:
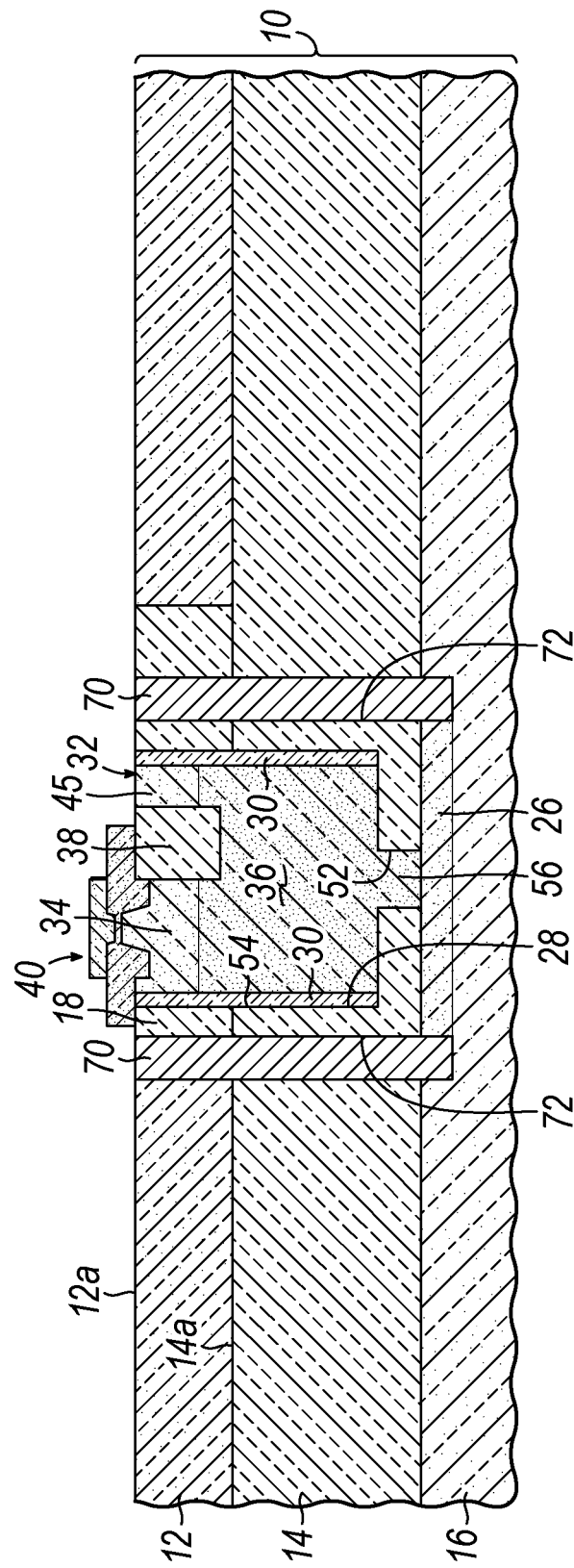
FIGS. 8A and 8B are cross-sectional views of a substrate portion processed by a processing method for fabricating a device structure in accordance with an alternative embodiment of the invention
Figure 8B:
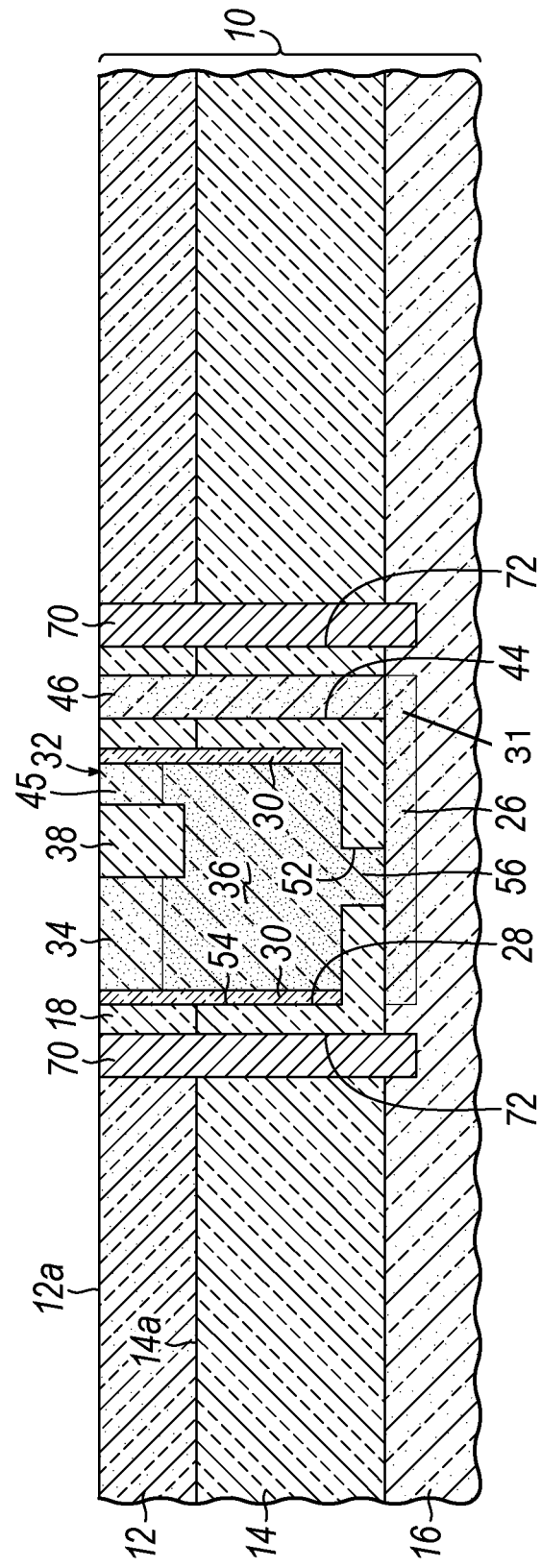

With reference to FIGS. 8A, 8B in which like reference numerals refer to like features in FIG. 5, the device construction may be modified to add trench isolation 70 that is formed in a deep trench 72. The trench isolation 70 and deep trench 72 penetrate through the device layer 12 or trench isolation region 18 to a shallow penetration depth into the high-resistance handle wafer 16. The deep trench 72 may be formed at the same time as the trench 44 for the plug 46 for the body contact and may be filled by a separate deposition process as the materials of the plug 46 and the trench isolation 70 differ. The trench isolation 70 may be filled with a dielectric, such as silicon dioxide, or may be lined with a dielectric and filled with polysilicon. The trench isolation 70 may be utilized to isolate the device structure 40 from CMOS devices functioning as device structure 48.

The embodiments of the invention may permit power amplifiers, low noise amplifiers and switches to be produced using a single SOI technology using a high-resistance handle wafer.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a dimension within the horizontal plane.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a device structure using a silicon-on-insulator substrate that includes a handle wafer, the method comprising:
    forming a first trench isolation region in a device layer of the silicon-on-insulator substrate;
    implanting ions through the first trench isolation region and a buried insulator layer of the silicon-on-insulator substrate into a portion of the handle wafer to form a doped region in the handle wafer;
    after implanting the ions, forming a first trench extending through the first trench isolation region in the device layer and the buried insulator layer to a top surface of the handle wafer and the doped region, the doped region having a lateral extension extending laterally of the first trench;
    epitaxially growing a semiconductor layer within the first trench;
    forming a first device structure using at least a portion of the semiconductor layer;
    after forming the first device structure, forming a second trench extending through the first trench isolation region and the buried insulator layer to the lateral extension of the doped region; and
    forming a conductive plug in the second trench,
    wherein the doped region is coupled with the conductive plug to provide a conductive path to the lateral extension.

2. The method of claim 1 wherein the semiconductor layer has a higher dopant concentration proximate to the handle wafer than proximate to a top surface of the device layer.

3. The method of claim 1 further comprising:
    forming a second device structure using the device layer, wherein the first device structure is a power amplifier.

4. The method of claim 1 wherein forming the conductive plug comprises:
    filling the second trench with a conductor.

5. The method of claim 1 further comprising:
    forming a base layer on the semiconductor layer; and forming a second trench isolation region in the semiconductor layer to isolate the base layer from a collector contact region in the semiconductor layer.

6. The method of claim 1 wherein the first trench has a first portion of a first width within the device layer and a portion of the buried insulator layer adjacent to the device layer, the first trench has a second portion of a second width within the buried insulator layer proximate to the handle wafer, and the second width is less than the first width.

7. The method of claim 1 wherein the first trench has a first portion with a first width within the device layer and a portion of the buried insulator layer, the first trench has a second portion with a second width within the buried insulator layer proximate to the handle wafer, and the second width is greater than the first width, and further comprising:
  forming a collector contact extending through the device layer and the buried insulator layer to a portion of the semiconductor layer in the second portion of the first trench.

8. The method of claim 1 further comprising:
  forming deep trench isolation extending through the device layer and the buried insulator layer into the handle wafer adjacent to the first trench.

9. The method of claim 1 wherein the handle wafer has a resistivity greater than 1 kΩ-cm.

10. The method of claim 1 further comprising:
  forming non-conductive spacers on sidewalls of the first trench that extend vertically relative to the top surface of the handle wafer,
  wherein the non-conductive spacers are formed before epitaxially growing the semiconductor layer within the first trench.

11. The method of claim 10 wherein at least one of the non-conductive spacers is laterally arranged between the first trench and the second trench.

12. The method of claim 1 wherein the doped region is wider than the first trench.

13. The method of claim 1 wherein the doped region is offset laterally to only one side of the first trench.

14. The method of claim 1 further comprising:
  forming a second trench isolation region in the semiconductor layer,
  wherein the second trench isolation region extends only partially through a thickness of the semiconductor layer.

15. The method of claim 14 wherein the semiconductor layer has a lower section with a higher dopant concentration proximate to the handle wafer than an upper section proximate to a top surface of the device layer, the second trench isolation region extends fully through the lower section of the semiconductor layer, and the second trench isolation region extends only partially through the lower section of the semiconductor layer.

16. The method of claim 1 wherein forming the first trench extending through the first trench isolation region in the device layer and the buried insulator layer to the top surface of the handle wafer and the doped region comprises:
  before epitaxially growing the semiconductor layer within the first trench, forming an upper portion of the first trench within the device layer and a first portion of the buried insulator layer; and
  after forming the upper portion of the first trench, forming a lower portion of the first trench extending through a second portion of the buried insulator layer to the top surface of the handle wafer and the doped region,
  wherein the lower portion of the first trench has a width that is greater than a width of the upper portion of the first trench.

17. The method of claim 1 wherein forming the first trench extending through the first trench isolation region in the device layer and the buried insulator layer to the top surface of the handle wafer and the doped region comprises:
  before epitaxially growing the semiconductor layer within the first trench, forming an upper portion of the first trench within the device layer and a first portion of the buried insulator layer; and
  after forming the upper portion of the first trench, forming a lower portion of the first trench extending through a second portion of the buried insulator layer to the top surface of the handle wafer and the doped region,
  wherein the lower portion of the first trench has a width that is less than a width of the upper portion of the first trench.

* * * * *